United States Patent

Gamble

[15] 3,641,362

[45] Feb. 8, 1972

[54] LOGIC GATE

[72] Inventor: Edward Bernard Gamble, Granada Hills, Calif.

[73] Assignee: RCA Corporation

[22] Filed: Aug. 10, 1970

[21] Appl. No.: 62,399

[52] U.S. Cl. ..............................307/215, 307/216, 307/218, 307/299 A, 307/300

[51] Int. Cl. ..................................H03k 19/34, H03k 19/36

[58] Field of Search ...............307/216, 215, 299 A, 300, 218

[56] References Cited

UNITED STATES PATENTS

| | | | |
|---|---|---|---|
| 3,351,782 | 11/1967 | Narud | 307/216 |
| 3,315,100 | 4/1967 | Amodei | 307/216 |
| 3,233,125 | 2/1966 | Buie | 307/299 A |
| 3,083,303 | 3/1963 | Knowles | 307/215 |
| 3,560,761 | 2/1971 | Karoash | 307/215 |
| 3,473,047 | 10/1969 | Bohn | 307/215 |

*Primary Examiner*—Donald D. Forrer
*Assistant Examiner*—David M. Carter
*Attorney*—H. Christoffersen

[57] ABSTRACT

A logic circuit having a first multiemitter transistor each of whose emitters is connected to a different input terminal and whose collector is connected to a junction point. A second transistor, whose conduction is controlled by means of a plurality of diodes coupled between its base and a different one of the input terminals, has its emitter connected to the base of the first transistor. For one operating condition the emitter-to-base junctions of the first transistor as well as the diodes are reverse biased and the second transistor provides a high transient current followed by a lower steady state current, through the base-to-collector junction of the first transistor, into the junction point. For another operating condition at least one of the emitter-to-base junctions of the first transistor as well as at least one of the diodes are forward biased and a transient current is provided to the base of the first transistor which then draws its collector current out of the junction point.

10 Claims, 3 Drawing Figures

PRIOR ART

INVENTOR.
EDWARD B. GAMBLE
BY
Henry Schwartz
Attorney

INVENTOR.
EDWARD B. GAMBLE
BY
Henry [signature]
Attorney

LOGIC GATE

BACKGROUND OF THE INVENTION

Digital circuits are used for performing logical operations in computers and other data processing equipment. A type of digital circuit known as transistor-transistor logic (TTL) having good speed, power, and noise immunity characteristics, has become widely accepted.

Since their introduction, the performance of TTL circuits, a typical example of which is shown in FIG. 1, has improved due to the advances in processing technology. However, further improvement in the "turn on" time is presently limited by shunt and stray capacitances, and especially those capacitances such as $C_S$ associated with the collector region of the input multiemitter transistors.

The effect of the $R_{20}C_S$ time constant can be understood by reference to FIG. 2, which is the schematic diagram of a commercially available high noise immunity TTL gate. The input threshold voltage has been increased by the addition of the collector-to-base diode of transistor Q23 between the emitter of transistor Q28 and the base of transistor Q24. The connection of the emitter of Q23 to the collector of Q20 attempts to provide rapid removal of the stored base charge of Q24. However, the following disadvantages occurred due to these changes.

First, since the shunt capacitance ($C_S$) present at the collector of transistor Q20 must now be charged to a higher potential than in FIG. 1 (due to the base-to-collector diode drop of transistor Q23), the input current must be increased (from 1.6 milliamperes to 4.0 milliamperes in a typical circuit) to achieve the same turn on time as in the circuit of FIG. 1. This input current increase is undesirable because it reduces the fanout capacity of the circuit (from 10 to 4 in a typical example).

Second, when the input signals go low and transistor Q24 is to be turned off, it is evident that the shunting paths existing across the base of transistor Q24 include the series combination of the output impedance of the driving gate and the collector-to-emitter voltages of Q20 and Q23. Under normal operating condition, the potential required for current to flow through the shunting path exceeds that existing at the base of Q24 and no advantage is gained.

It is an object of this invention to provide a circuit of the same general class as those described above having improved noise immunity, without accompanying increase in power dissipation, or accompanying reduction of fanout capability of sacrifice in speed.

SUMMARY OF THE INVENTION

A logic circuit having a first multiemitter transistor, each of whose emitters is connected to a different input terminal and whose collector is connected to a junction point. A second transistor, whose conduction is controlled by means of a plurality of asymmetrically conducting devices, coupled between its base and a different one of the input terminals, has its emitter connected to the base of the first transistor. For one condition of input signals, the emitter-to-base junctions of the first transistor as well as the devices are reverse biased and the second transistor provides a current through the base-to-collector junction of the first transistor into the junction point. For another input signal condition as least one of the emitter-to-base junctions of the first transistor as well as at least one of the devices are forward biased and a transient current is provided to the base of the first transistor which then draws its collector current out of the junction point.

DESCRIPTION OF THE INVENTION

CIRCUIT DESCRIPTION

Figure 1:
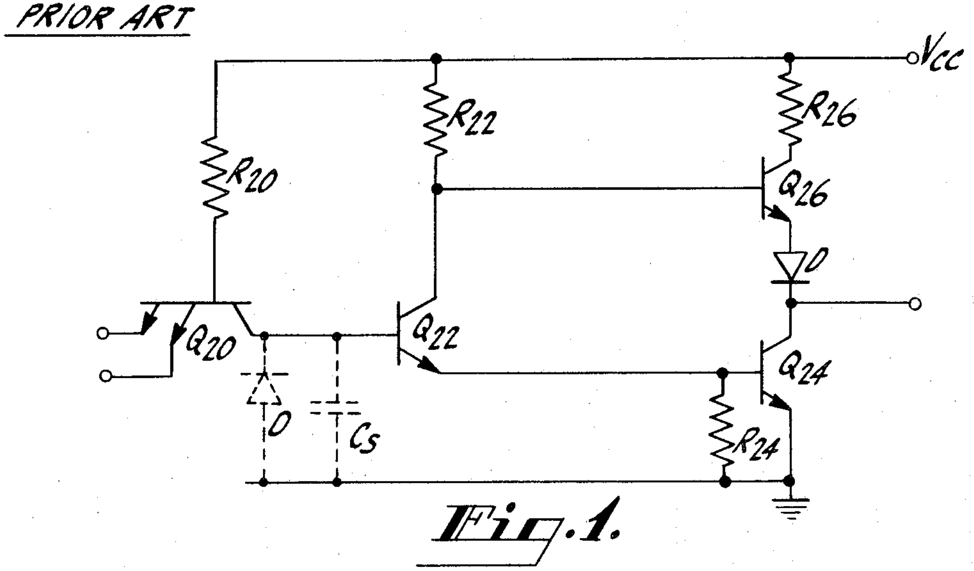
Fig. 1. PRIOR ART
FIG. 1 is a schematic diagram of a basic TTL logic gate.
Figure 2:
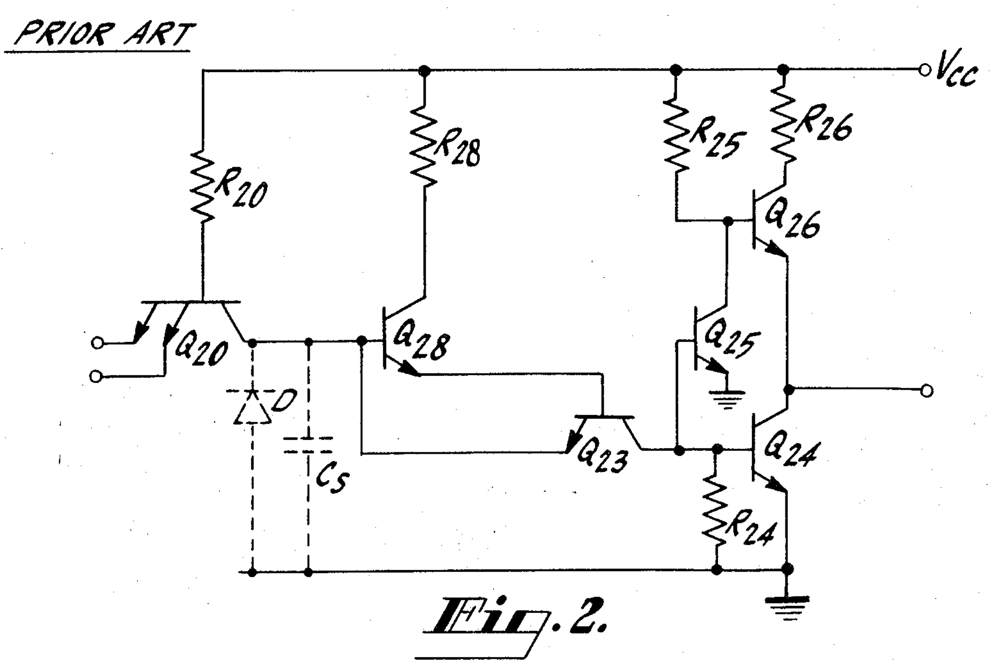
FIG. 2 is a schematic diagram of another TTL gate known in the art.
Figure 3:
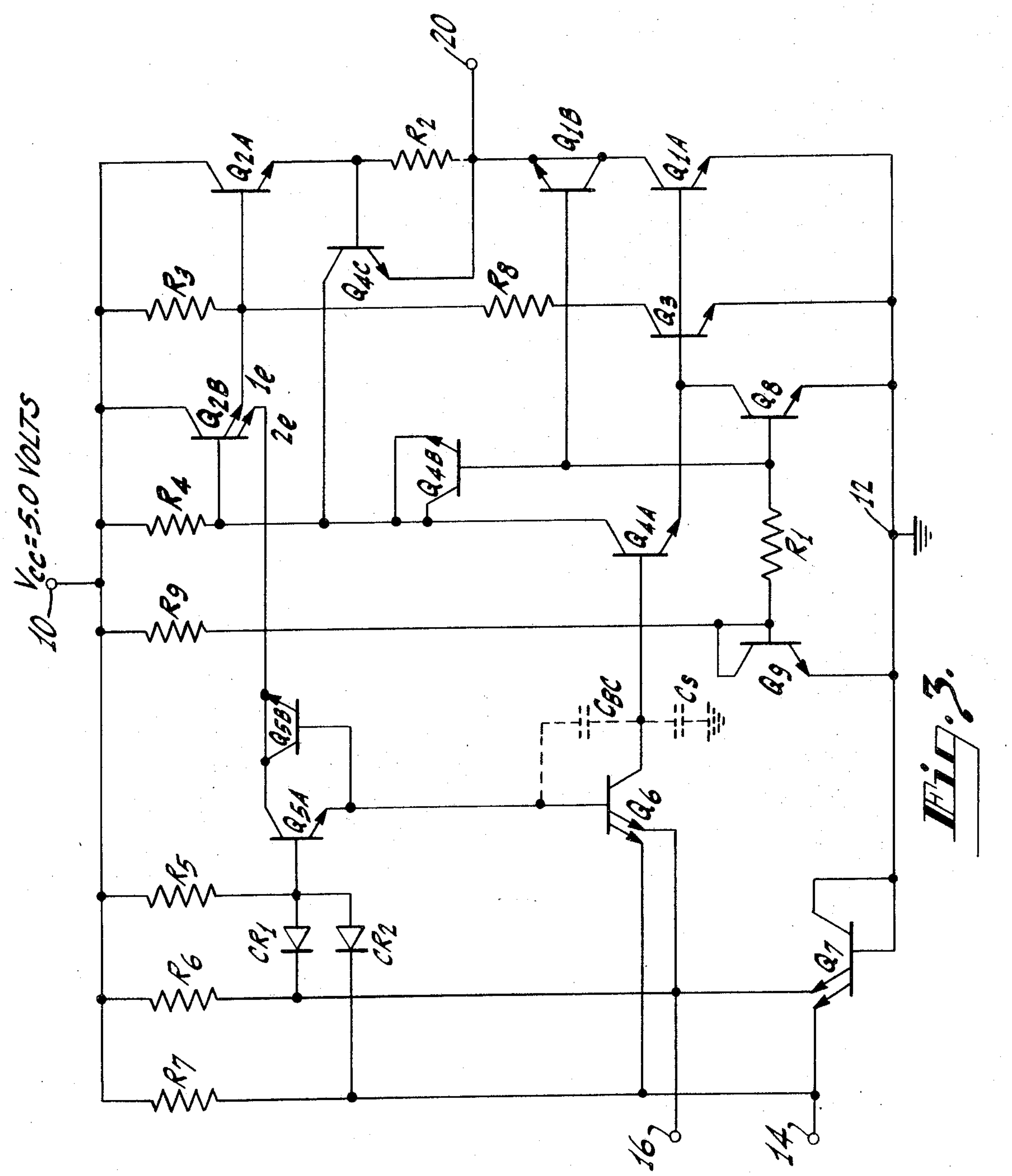
FIG. 3 is a schematic diagram of a logic gate embodying the invention.

The two-input logic circuit of FIG. 3 includes an input section which combines features of diode-transistor logic (DTL) and transistor-transistor logic (TTL). Some transistors in FIG. 3 are identified by numerical and alphabetic subscripts. This is done to emphasize that all transistors having the same numerical subscript may have the same collector diffusion.

The input section includes multiemitter transistor Q6 having its collector connected to the base of transistor Q4A and each of its emitter electrodes to a different one of the input terminals 14, 16. Capacitance $C_S$, connected between the collector of transistor Q6 and ground, is drawn with dashed lines to indicate that it is a distributed parameter. $C_S$ represents the collector-to-substrate capacitance of transistor Q6 as well as any other distributed and stray capacitance associated with that node. Capacitance $C_{BC}$, also drawn with dashed lines, includes the collector-to-base capacitance of transistor Q6. The circuit may have more than two input terminals and transistor Q6 may have more than two emitters but for ease of illustration the drawing is so limited. Diode connected transistor Q7 which has its collector and base connected in common to terminal 12 and each of its two emitters to a different one of the input terminals (14, 16) is provided to suppress positive and negative going transients. Pullup resistors R6 and R7 are connected between power supply terminal 10 and input terminals 16 and 14, respectively.

As in DTL circuits, input diodes CR1 and CR2 have their cathodes connected to terminals 16 and 14 respectively and their anodes connected in common to the base of transistor Q5A to which is also connected one end of current source resistor R5. The other end of resistor R5 is connected to positive power supply 10 so that current through resistor R5 is in a direction to forward bias the base-to-emitter junction of transistor Q5A and/or diodes CR1 and CR2. The emitter of transistor Q5A is connected to the base of transistor Q6 and the collector of transistor Q5A is connected to the second emitter electrode 2*e* of collector load (current) switching transistor Q2B. Transistor Q5B has its base connected to the emitter of transistor Q5A and its collector and emitter connected in common to the collector of transistor Q5A. The capacitances associated with the collector-base and emitter-base junctions of transistor Q5B are thus connected in parallel across the collector-to-emitter of transistor Q5A.

The first emitter 1*e* of transistor Q2B is connected in common to the base of transistor Q2A and to one end of resistors R3 and R8. The other ends of resistors R3 and R8 are connected to terminal 10 and to the collector of transistor Q3, respectively. Resistor R4 is connected between the base of transistor Q2B and terminal 10 and the collectors of transistors Q2B and Q2A are connected to terminal 10. The collectors of transistors Q4C and Q4A as well as the collector and emitter of transistor Q4B are connected to the base of transistor Q2B. The collector-to-base as well as the emitter-to-base junctions of transistor Q4B are connected in parallel between the collector of transistor Q4A and the base of transistor Q8. This, as explained below, provides AC coupling between the two points. The emitter of transistor Q4A is connected to the collector of shunt bias transistor Q8 and the bases of transistors Q3 and Q1A. The emitters of transistors Q3, Q1A and Q8 are connected to the negative power supply terminal 12.

The collector of transistor Q1A is connected to output terminal 20 to which is also connected the base and collector of transistor Q1B, the emitter of transistor Q4C, and one end of resistor R2. The other end of resistor R2 is connected in common to the base of transistor Q4C and the emitter of transistor Q2A. The combination of transistor Q4C and resistor R2 provides current regulation and limits the output current to a safe value. The base electrodes of transistors Q1B and Q4B are connected in common to the base of transistor Q8 to which is also connected one end of resistor R1. The base of transistor Q8 is thus coupled by means of the junction capacitances of transistors Q4B and Q1B, respectively, to the collector of transistor Q4A and to the collector of transistor Q1A.

A bias network to generate a relatively constant steady state shunt current includes resistor R9 and R1 and transistors Q9 and Q8. Resistor R9 is connected between terminal 10 and the common connection of the base and collector of diode connected transistor Q9. The emitter of transistor Q9 is connected to terminal 12 and resistor R1 which controls the amount of base current into transistor Q8 is connected between the base of transistors Q9 and Q8.

CIRCUIT OPERATION

The operation of the circuit is best understood by examining the response of the circuit to a complete cycle of the input wave form, i.e., (1) all signal inputs in the steady state "high" condition; (2) transition of at least one input from the "high" to the "low" condition; (3) at least one input in the steady state "low" condition; (4) transition of all "low" inputs to the "high" condition. Assume for the remainder of this description that the magnitude of the potential applied between terminals 10 and 12 is approximately 5 volts and that the base-to-emitter voltage drop, $V_{BE}$, of these transistors in the forward direction is approximately 0.75 volts.

I. Assume that the input signals applied to terminals 14 and 16 are "high" with each signal being 4 volts or more. Under this condition, a steady state current flows through current source resistor R5, the base-to-emitter junction of transistor Q5A, the base-to-collector junction of transistor Q6, into the base of transistor Q4A and, amplified, out of the emitter of transistor Q4A to provide the base current for transistors Q3 and Q1A, which are connected in parallel, and the collector current for transistor Q8. If the potential at the base of transistor Q3 and Q1A is 0.75 volt, the voltage at the base of transistor Q4A is 1.5 volts, the voltage at the base of transistor Q6 is 2.25 volts and the voltage at the base of transistor Q5A is 3 volts. Since the input signals applied at terminals 14 and 16 are assumed to be at least 4 volts, diodes CR1 and CR2 are reverse biased. In addition, the multiple emitter-to-base junctions of transistor Q6 are also reverse biased since the base is at 2.25 volts while the emitters are at least at 4 volts.

Transistor Q4A is operated as a phase splitter, amplifying the base current supplied to its base and generating in response thereto an in-phase signal at the emitter and an out-of-phase signal at the collector. In the all inputs "high" steady state condition, transistor Q4A is saturated since its forward current transfer ratio ($\beta$) exceeds the ratio of available collector current ($I_{C4A}$) to available base current ($I_{B4A}$). In other words, $\beta \times I_{B4A}$ is greater than the available $I_{C4A}$.

Assuming the collector-to-emitter saturation voltage of transistor Q4A to be approximately 0.25 volt ($V_{CE_{SAT}} = 0.25$ volt) and its emitter to be at 0.75 volt, the collector potential of transistor Q4A is approximately 1.0 volt. In order for current to flow from the second emitter of transistor Q2B, the potential at its base must exceed 3.1 volts (the potential at the emitter of transistor Q5A plus the $V_{CE}$ offset of transistor Q5A plus the $V_{BE}$ of transistor Q2B). Thus, since the base potential of transistor Q2B is maintained at 1.0 volt by the collector of transistor Q4A, no current flows into the collector-to-emitter of transistor Q5A and its collector-to-emitter voltage is equal to the $V_{CE}$ offset.

It is of importance to note at this point that in this steady state condition, transistor Q5A permits base-to-emitter current flow but provides no collector-to-emitter current. Transistor Q5A is thus operated as a diode and there is no increase in power dissipation under steady state conditions due to its presence. It should also be noted that transistor Q2B which provides the collector current to transistor Q5A is rendered nonconducting by means of the conduction of transistor Q4A in response to the amount of current generated by transistor Q5A.

The emitter current of saturated transistor Q4A is comprised of the current through resistor R5 ($I_{R5}$) and the current through resistor R4 ($I_{R4}$). $I_{R5}$ is approximately equal to the difference in potential between terminal 10 (5 volts) and the base of transistor Q5A ($4 \times V_{BE}$) divided by the ohmic value of R5, $[V_{cc} - 4 \times V_{BE}/R5]$; and, $I_{R4}$ is approximately equal to the difference in potential between terminal 10 (5 volts) and the collector voltage of Q4A $(V_{BE} + V_{CE_{SAT}})$ divided by the ohmic value of resistor R4, $[V_{cc} - (V_{BE} + V_{CE_{SAT}})]/R4$. The emitter current of transistor Q4A provides the base drive for transistors Q3 and Q1A and the collector current to transistor Q8. The amount of current division between the bases of transistors Q3 and Q1A is a function of the ratio of their areas and the ratio of actual emitter currents. The division of base currents is controlled to ensure that Q1A is capable of sinking the variable load current into output terminal 20 which may, for example, range from 2.5 milliamperes to 20 milliamperes. Sufficient base drive must be applied to transistor Q1A to make sure that it is saturated when carrying the maximum rated output load current which must be sunk. In addition to the base drive to transistor Q1A sufficient base drive must be supplied to transistor Q3 in order to cause it to saturate. The sum of these two base currents plus the constant collector current shunted by transistor Q8 is supplied by the emitter current of transistor Q4A. Transistor Q8, as more fully set forth below, acts as a shunt path across the base-to-emitter regions of transistors Q3 and Q1A and due to AC coupling into its base, causes transistors Q3 and Q1A to turn "off" rapidly when the input signals go low.

The steady state collector current drawn by transistor Q8 is determined by the biasing circuit comprising resistor R9, diode connected transistor Q9 and resistor R1. The current through resistor R9 ($I_{R9}$) is substantially equal to the difference in potential between $V_{cc}$ and the $V_{BE}$ of transistor Q9 divided by the resistance of R9, $[V_{cc} - V_{BE}/R9]$. Most of this current flows into the collector and base of transistor Q9 developing a potential which is applied across the series combination comprising resistor R1 and the base-to-emitter junction of transistor Q8. The current through resistor R1 and into the base of transistor Q8 is approximately equal to the difference in potential between the base-to-emitter voltage of transistor Q9 and the base-to-emitter voltage of transistor Q8 divided by the ohmic value of resistor R1; $(V_{BE_9} - V_{BE_8})/R1$. (In addition to the difference in size, transistor Q9 conducts more collector current than transistor Q8 and hence the $V_{BE}$ of the former will be greater than that of the latter.) The collector current of transistor Q8 ($I_{Q8}$) may thus be adjusted to be a well defined ratio of the collector current of transistor Q9 ($I_{Q9}$).

In a circuit embodying the invention, $I_{Q9}$ was set to approximately 500 microamperes by making resistor R9 equal to 10 kilohms. Resistor R1 was selected to be a minimum of 1 Kohm to isolate (somewhat) the base of transistor Q8 from the base of transistor Q9. Transistor Q8 was designed to ensure that, with R1 equal to 1 Kohm, the steady state value of $I_{Q8}$ was approximately equal to one-half $I_{Q9}$ ($\approx$250 microamperes). Transistor Q8 thus sinks a small steady state current which results in a very efficient bias control and in minimal current waste.

With transistor Q4A conducting and saturated, the potential at the base of transistor Q2B is 1 volt. Assuming transistor Q3 also to be saturated and its collector-to-emitter saturation voltage to be 0.2 volt, the current flowing through resistors R2 and R8 is approximately 2.25 milliamperes. If, for example, resistor R8 is 100 ohms, the potential at the first emitter 1*e* of transistor Q2B, which is common to the base of transistor Q2A, is approximately 0.425 volt. Under this condition, the base of transistor Q2B is forward biased with respect to its first emitter by a potential of 0.575 volt. Since the threshold of the base-to-emitter junction is 0.75 volt, transistor Q2B is not biased into conduction.

Maintaining the base-to-emitter potential of transistor Q2B slightly below the turn on threshold is advantageous in that it permits very rapid turn on of the transistor. Since most of the charge needed to turn on transistor Q2B is stored during the steady state operation, little additional charge is required to turn it on completely (as described below) and this minimizes its turn on time.

With transistors Q3 and Q1A saturated, the base potential of transistor Q2A is maintained at 0.425 volt and its emitter potential is equal to the potential at output terminal 20 which is equal to the saturation voltage of transistor Q1A. The base-to-emitter potential of transistor Q2A is thus well below the 0.75-volt threshold and transistor Q2A, though forward biased, remains nonconducting.

Finally, it should be noted that for the steady state condition, there is no conduction in or through the junctions forming transistors Q1B, Q4B and Q5B.

II. One or more of the input signals (applied to terminals 14 and 16) make a transition from the steady state "high" of 4 volts or more to a "low" of 0.35 volt or less.

The negative-going transition at the input occurs very quickly and the response of the present circuit follows almost as rapidly. However, it is important for a better understanding of the operation and to best appreciate the advantages of the circuit, to identify the sequence of events that occur in the circuit as the input signal switches from "high" to "low."

First, when the input signal voltage reaches 2.25 volts, the current in resistor R5 ceases to flow into the base region of Q5A and instead begins flowing through one or both of the input diodes CR1 and CR2 (depending on which of the input signals has made the transition to "low"). Assuming the threshold of diodes CR1 and CR2 to be 0.75 volt and recalling that under steady state conditions the base of transistor Q5A is at 3 volts ($4V_{BE}$), it follows that the current through R5 will flow into CR1 or CR2 when the signal associated with their input terminal drops below 2.25 volts.

Secondly, when the input signal reaches 1.5 volts, the base-to-emitter junction of transistor Q6 ($V_b$ of transistor Q6 is assumed to remain at 2.25 volts during the input transition from 2.25 to 1.5 volts) becomes forward biased and the emitter current of transistor Q5A ceases to flow into the base collector diode of transistor Q6. It is important to note that the circuit thus exhibits a dual threshold characteristic. The first threshold as described above occurs when one or both diodes CR1 and CR2 begin conducting preventing further base drive into transistor Q5A and the second threshold occurs when the base-to-emitter junction of transistor Q6 begins conducting. The importance and usefulness of this dual threshold characteristic is described subsequently.

The effectiveness of transistor Q6 to switch the charge carriers from $C_S$ is not obvious, because no steady state current is supplied at this time to its base (which ordinarily would be present in conventional TTL circuits). However, in this circuit, transient current provides base current to transistor Q6 which causes transistor Q6 to conduct as a transistor and therewith carry out its sweeping function with respect to $C_S$. It is to be recalled that in the previous steady state condition when the base-emitter junctions of transistor Q6 are reverse biased, transistor Q6 has been in saturation with all its base current flowing to its collector. Transistors operating in this mode exhibit delays times of a few hundred picoseconds when a current is subsequently drawn from their emitters. Thus, when one or more of the base-emitter junctions of transistor Q6 becomes forward biased, the charge stored in the base collector junction is instantly available to provide current into the base. Additionally, as the input continues to fall from 1.5 volts to 0.35 volt or less, the base of transistor Q6 falls concurrently from 2.25 volts to 1.10 volts or less, because one or more of its base-to-emitter regions is forward biased.

If it is assumed, for the instant, that the collector potential of transistor Q6 were to be maintained at 1.5 volts, two capacitances would contribute to the base drive of transistor Q6. The stray base to substrate capacitance (not shown) and the collector-to-base capacitance would provide their stored charge to the base of transistor Q6 since the base-to-emitter region of transistor Q6 provides a path for the flow of their charges. The base current in transistor Q6 causes a current to flow between the collector and emitter which is its forward current ratio ($\beta$) times the base current. The collector-to-emitter current thus sweeps out the charges present on $C_S$. During this period there is one action that is detrimental to the performance of transistor Q6. That is, the stored base-to-emitter charge of transistor Q5A must be reduced to zero by flowing in the reverse direction through the base-to-emitter of transistor Q6. However, it can be shown that the available forward charge exceeds the reverse charge by an adequate margin. In practice, measured waveforms at the collector of transistor Q6 in the circuit embodying the invention are not discernibly different than those of a standard TTL circuit. Thus it has been shown that transistor Q6 conducts current from its collector to its emitter in transistor fashion thereby rapidly removing or "sweeping" the charge stored at the base of transistor Q4A and turning it off very quickly. It should also be appreciated that a signal transistor (Q6) is connected between the base of transistor Q4A and the input terminals. This assures that when transistor Q6 conducts and saturates, a very low impedance or saturation voltage is present between the base of Q4 and the input node.

The operation of transistor Q6 may be further enhanced by means of the addition of transistor Q5B which is operated as a capacitor and which couples the rising potential at the collector of transistor Q5A to the base of transistor Q6. As the collector voltage of transistor Q5A becomes more positive (transistor Q5A is being turned off and transistor Q4A is being turned off allowing Q2B whose base is connected through resistor R4 to $V_{cc}$ to drive the collector of transistor Q5A towards $V_{cc}$) more charge is coupled to the base of transistor Q6 (driving it harder into conduction) through the capacitance of the reverse biased junctions of transistor Q5B.

The cutoff of transistor Q4A is further aided by the stored charge of transistors Q3 and Q1A since they maintain the emitter of transistor Q4A at a positive potential which causes the base-to-emitter junction of transistor Q4A to be momentarily reverse biased. This occurs since the emitter of transistor Q4A is momentarily held at 0.75 volt while its base voltage is equal to the low level (0.35 volt maximum) plus the saturation voltage of transistor Q6 which may be assumed to be 0.3 volt maximum for this condition.

With the cutoff of transistor Q4A, no more current is supplied to the bases of transistors Q3 and Q1A. The stored charge on the bases will normally be removed by the collector current of forward biased transistor Q8. In addition to the steady state bias the base of transistor Q8 is also AC coupled to the collector of transistor Q4A by means of the capacitance of the reverse biased junctions of transistor Q4B. As Q4A cuts off, its rise in collector voltage is AC coupled to the base of transistor Q8. Transistor Q8 which was conducting a steady and relatively constant current (250 microamperes) starts conducting additional collector current immediately. The additional current which transistor Q8 can carry is the AC current coupled through capacitor Q4B multiplied by the forward current ratio of transistor Q8. The decoupling provided by resistor R1 now becomes important since its resistance ensures that the AC coupled current flows largely into the base of Q8 rather than being shunted into the collector of transistor Q9. Transistor Q8 conducts an increased collector current so long as the collector potential of transistor Q4A rises and thus cuts off transistors Q1A and Q3 quickly and positively.

Concurrently with the rise in the collector voltage of transistor Q4A, transistor Q2B is turned on. Transistor Q2B is turned on very quickly since only a slight positive increment in its base voltage is necessary to turn it on. Transistor Q2B provides a current into the base of transistor Q2A equal to its forward current ratio multiplied by the base current available to it. There is negligible resistance limiting the current flow between the emitter of transistor Q2B and the base of transistor Q2A which minimizes the turn on time of Q2A. During the time that transistors Q2B and Q2A are turning on, the stored charges associated with transistors Q1A and Q3 have been "swept out" by transistor Q8 reducing their collector current to zero.

Transistors Q1A and Q3 are quickly turned off when transistor Q2A is turned on to prevent undesirable power transients and the associated increase in power dissipation. Another major advantage of concurrently turning off Q1A and turning on Q2A is that the total emitter current of transistor Q2A is made available to charge the load capacitance which rapidly drives the signal at output terminal 20 to the "high" state.

The output is also AC coupled to the base of Q8 by means of the reverse biased junctions of transistor Q1B. As the voltage at output terminal 20 rises, the signal is fed back to the base of transistor Q8 which conducts more current as described above. This increased current of transistor Q8 offsets the effect of the Miller capacitance associated with the collector-to-base junction of transistor Q1A. Thus, though the rise in the collector voltage of transistor Q1A is coupled back to its base by its collector-to-base capacitance, the increased conduction of transistor Q8 effectively prevents the additional charge from flowing into the base of transistor Q1A.

III. One or more inputs at a steady state "low" of 0.35 volt or less. Under this condition, steady state current flows through resistor R5 and through the anode to cathode junctions of these diodes (CR1, CR2) whose input signals are low. In addition, bias current flows through resistor R9 into the base of transistor Q8. The collector current of transistor Q8, as described above, shunts to ground any leakage current due to transistors Q4A, Q3 or Q1A and therefore maintains transistors Q3 and Q1A in the cutoff condition. With transistor Q3 cut off all base current that may be required to support the load current at the emitter of transistor Q2A flows through resistor R3 and into output terminal 20.

All other transistor junctions are nonconducting in this steady state condition except for leakage currents which may be neglected. The power dissipation for the steady state "low" condition is thus minimized by using a biasing scheme which draws very little current in the steady state.

IV. Transition of all "low" inputs from 0.35 volt or less to 4.0 volts or more. The transition of the input signals, as noted above, occurs within a few nanoseconds. However, the sequence or events as the voltage increases are identifiable and are set forth to bring out more clearly the operation of the circuit. First, the current through resistor R5 starts transferring from the input diodes into the base of transistor Q5A. Total current transfer of the current through resistor R5 does not occur until the input voltage reaches 2.25 volts. However, the transfer of some current starts immediately, with the positive going transition of the input signal, since the emitter of transistor Q5A is held at a low value of potential by various stray and shunt capacitances coupling it to the substrate and hence to ground potential.

It is important to note that the current available at the emitter of transistor Q5A to charge these capacitances is the available base current multiplied by the forward current ratio of transistor Q5A. During the transient interval following the positive going transition, the collector-to-second emitter of transistor Q2B provides a very low impedance between the collector of transistor Q5A and the source of potential $V_{cc}$. That is, transistor Q2B can provide all the collector current that transistor Q5A requires. Transistor Q2B has thus changed from a very high impedance cutoff condition (described under I above) to a relatively low impedance (highly forward biased condition). The high conduction level of transistor Q5A is an important feature of the configuration since it avoids undesirable delay in charging the capacitance associated with the input of transistor Q4A. Thus the base of Q4A reaches its required turn on threshold voltage (1.5 volts) very rapidly. Transistor Q5A continues to amplify the current generated through current source resistor R5 and to apply the amplified current to transistor Q4A until the potential at the collector of the latter falls below approximately 3 volts. At that point the collector potential of transistor Q5A tends to become lower than its emitter potential since transistor Q2B is being cut off by the signal fed back from the collector of transistor Q4A. There is thus a feedback arrangement which cuts off the supply of collector current to transistor Q5A when its emitter current causes the collector potential of transistor Q4A to fall below 3.0 volts. Following the charging transient, transistor Q5A is effectively turned into a diode since its collector supply is cut off. Transistor Q5A thus provides an amplified current during the initial transient period to ensure rapid turn on and a steady state current of much lower amplitude thereafter. As the gate output is being switched in response to the increasing signal at the input terminal, the collector supply of transistor Q5A is cut off and the steady state power dissipation is reduced to a level typical of a much slower logic gate.

Another advantage of the circuit embodying the invention is the increased noise immunity. The noise immunity levels of the gate may be calculated assuming that the maximum value of the "low" output is 0.35 volt and the minimum value of the "high" output is 3.8 volts and recalling that: (1) all input signals must make a positive going transition from a "low" (0.35 volt) to slightly more than a 2.25-volt threshold to reverse bias the input diodes and cause the logic gate output at terminal 20 to switch from a "high" (3.8 volts) to a "low" (0.35 volt); and (2) at least one input signal must make a negative going transition from a "high" (3.8 volts) to slightly less than the 2.25-volt threshold to forward bias the input diodes (and to less than 1.5 volts to forward bias transistor Q6 to cause the logic gate output at terminal 20 to switch from a "low" (0.35 volt) to a "high" (3.8 volts). It is evident that: (1) for the condition of at least one input "low," a positive going noise pulse applied to the input terminal would have to exceed 1.9 volts (2.25 volts–0.35 volts) before initiating the sequence of events which cause the output 20 of the logic gate to switch from "high" to "low;" and (2) for the condition of all inputs "-high" a negative going noise pulse applied to the input would have to exceed 1.55 volts (3.8 volts–2.25 volts) before initiating a gradual response and exceed 2.3 volts ( 3.8 volts–1.5 volts) before initiating the rapid sequence of events which cause the output 20 of the logic gate to switch from "low" to "high."

In measurements on a circuit embodying the invention it was found that the threshold voltage at the base of transistor Q6 was 2.1 volts as compared to the 2.25 volts used in the example above. The level of 2.1 volts is reasonable since $V_{BE}$ is a function of the current therethrough and the temperature thereof and may vary considerably about the value of 0.75 volt. Assuming the same limits on the "low" output (0.35 volt) and the "high" output (3.8 volts), as above, the noise immunity level with the output low was found to be 1.75 volts for both high- and low-frequency noise signals, and the high noise immunity level was found to be 1.7 volts for low-frequency noise signals and 2.30 volts for high-frequency noise signals (spikes).

The dual-threshold characteristic and its desirable effect on the noise immunity characteristics exhibited by the circuit are further illustrated by the response of the circuit to the following test. Measurements were made of the time required for the output to go from a "low" level to 2 volts with the following results: (1) a negative-going transition from 4 volts to zero volt had to be applied to the input for only 9 nanoseconds before the output reached 2 volts; (2) a negative-going transition from 4 volts to 1 volt had to be applied for 17 nanoseconds in order to cause the output to switch from a "low" to 2 volts; and (3) a negative pulse transition from 4 volts to 1.5 volts had to be applied for 125 nanoseconds before the output goes from a "low" to the 2-volt level. It is thus evident that the input characteristics render the circuit relatively immune to noise pulses appearing on the input lines.

It has thus been shown that the noise immunity of the gate may be increased and that such increased noise immunity may be obtained without increasing the power dissipation decreasing the speed, or reducing the fanout capability.

The transistors used in the embodiment shown in FIG. 3 are all of the NPN-type but it should be obvious that transistors of a different type of comparable speed could also have been used.

What is claimed is:

1. In a logic circuit, in combination:

a first transistor having a collector, base and emitter;

a current source;

a second transistor having a collector, base and emitter, directly connected at its base to said current source and at its emitter to the base of said first transistor, the base-to-emitter path of said second transistor being in the forward direction relative to the flow of current from said source;

an asymmetrically conducting device connected between the emitter of said first transistor and the base of said second transistor, said device being poled in the forward direction relative to the flow of current from said source;

a signal input terminal at said emitter of said first transistor; and means for applying a signal to said input terminal which, when of one value, is sufficient to forward bias said device for causing the current from said current source to flow into said device and into said input terminal, and when of second value is sufficient to reverse bias said device and the emitter-to-base path of said first transistor for causing the current from said current source to flow through the base to emitter path of said second transistor and the base-to-collector path of said first transistor.

2. In a logic circuit as set forth in claim 1, further including a third transistor having a base, emitter and collector, the emitter of said third transistor being connected to the collector of said second transistor, and the collector of said third transistor being connected to a source of operating potential poled in a direction to permit said third transistor to conduct current through its collector-to-emitter path to said second transistor; and means coupled to the base of said third transistor and responsive to said first transistor for controlling the state of said third transistor.

3. The combination as claimed in claim 2 wherein said last-named means comprises a fourth transistor having collector, base and emitter, connected at its base to the collector of said first transistor and responsive to base-to-collector current flow in said first transistor for conducting and applying a signal to the base of said third transistor for cutting the latter off.

4. The combination as claimed in claim 2, wherein said last-named means comprises a fourth transistor having a collector, base and emitter, connected at its base to the collector of said first transistor and responsive to base-to-emitter current flow in said first transistor for being driven to cutoff and for applying a signal to the base of said third transistor for driving the latter into conduction.

5. In a logic circuit as set forth in claim 1, said asymmetrically conducting device comprising a diode.

6. The combination as claimed in claim 5 further including:

first and second power terminals for a source of operating potential, and wherein said current source includes a resistor connected at one end to the base of said second transistor and at the other end to that one of said two power terminals which is poled to forward bias the base-to-emitter junction of said second transistor.

7. The combination as claimed in claim 6 further including a resistor connected at one end to said signal input terminal and at the other end to that one of the two power terminals whose potential is in a direction to reverse bias said asymmetrically conducting device.

8. The combination as claimed in claim 3 further including at least one alternating current coupling element coupled between the collector of said second transistor and the base of said first transistor responsive to an abrupt change in potential at the collector of said second transistor for alternating current coupling a corresponding change in voltage to the base of said first transistor.

9. The combination as claimed in claim 8 wherein said coupling element comprises a reverse biased semiconductor junction.

10. In a logic circuit, in combination:

a plurality of input signal terminals adapted to receive multivalued signals;

a transistor having a plurality of emitters each connected to a different one of said input terminals, a base, and a collector having a capacitance associated therewith;

a source of current;

current amplifying means, having a control electrode connected to said source of current, for amplifying the current from said current source and for supplying the amplified current to the base of said transistor, said amplified current flowing from the base-to-collector of said transistor for charging the capacitance associated therewith in response to signals applied at said input terminals having a value to reverse bias the base-to-emitter junctions of said transistor;

asymmetrically conducting means, connected between the control electrode of said current-amplifying means and a different one of said input terminals in a direction to easily conduct current from said control electrode to said input terminals, said asymmetrically conducting means being responsive to signals having a first voltage level applied at said input terminals in a direction to forward bias one or more of the emitter-to-base junctions of said transistor for causing said current source current to flow through said asymmetrically conducting means and thereby preventing the further flow of current source current to said amplifying means.

* * * * *